United States Patent [19]

Sugiura et al.

[11]  4,451,904
[45]  May 29, 1984

[54] SEMICONDUCTOR MEMORY DEVICE

[75] Inventors: June Sugiura, Musashino; Yasunobu Kosa, Kodaira; Kazuhiro Komori, Kodaira; Ken Uchida, Kodaira; Shinji Shimizu, Houya, all of Japan

[73] Assignee: Hitachi, Ltd., Tokyo, Japan

[21] Appl. No.: 228,086

[22] Filed: Jan. 26, 1981

[30] Foreign Application Priority Data

Feb. 1, 1980 [JP] Japan .................................. 55-9929

[51] Int. Cl.³ ............................................. G11C 11/40
[52] U.S. Cl. .................................. 365/182; 365/185; 357/23
[58] Field of Search ............... 365/174, 182, 184, 185; 357/23 VT

[56] References Cited

U.S. PATENT DOCUMENTS 4,145,759  3/1979  Remedi .............................. 365/203
4,173,791  11/1979 Bell .................................... 365/182
4,335,391  6/1982  Morris ................................. 357/23

FOREIGN PATENT DOCUMENTS 3037315  4/1981  Fed. Rep. of Germany .

Primary Examiner—Joseph A. Popek
Attorney, Agent, or Firm—Kenyon & Kenyon

[57] ABSTRACT

A semiconductor memory device includes a number of conductive layers for bit and selection lines alternately juxtaposed on the surface of a semiconductor substrate beneath a field insulating layer, with a number of MOS type memory cells arranged between the conductive layers for the bit and selection lines.

6 Claims, 29 Drawing Figures

SEMICONDUCTOR MEMORY DEVICE

BACKGROUND OF THE INVENTION

The present invention relates to a semiconductor memory devices such as EPROMS (Electrically Programmable Read Only Memory) which are equipped with MOS (Metal-Oxide-Semiconductor) type memory cells in general, and more particularly to improvements in an inter-cell wiring structure or a cell arranging structure in a semi-conductor memory device.

As used herein the terminology MOS type is considered to have a broad meaning, as an insulated gate field effect type. In other words, the gate electrode is not limited to a metal material but can be constructed of a semiconductor material such as polycrystalline silicon or metal-silicide materials. On the other hand, the gate insulating film is not limited to an oxide film such as a silicon oxide but can be constructed of an insulating material such as a silicon nitride ($Si_3N_4$) or a multi-layer films of those materials and a silicon oxide.

SUMMARY OF THE INVENTION

It is a basic object of the present invention to provide a highly integrated semiconductor memory device.

Another object of the present invention is to provide a highly integrated EPROM.

Still another object of the present invention is to provide a highly integrated reliable EPROM.

A semiconductor memory device according to the present invention is characterized in that a number of conductive layers for bit and selection lines are alternately juxtaposed on the surface of a semiconductor substrate beneath a field insulating film, and in that a number of MOS type memory cells are arranged between the conductive layers for the bit and selection lines.

DETAILED DESCRIPTION

Figure 1:
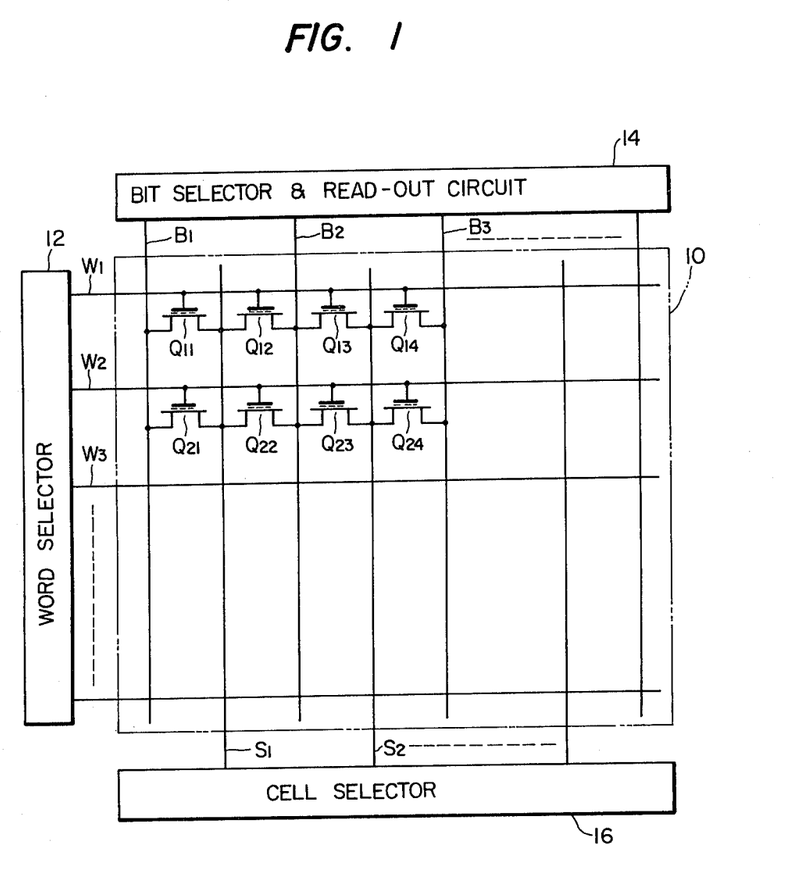
FIG. 1 is a circuit diagram showing a semiconductor memory device according to the present invention.

FIG. 1 is a circuit diagram showing an EPROM according to the present invention. A cell array circuit 10 includes a number of MOS memory cells $Q_{11}$ to $Q_{14}$ and $Q_{21}$ to $Q_{24}$ which are arranged in a matrix shape on the surface of a semiconductor substrate. Each of the aforementioned MOS memory cells is constructed, as will be described from the following description, of one MOSFET, in which a floating gate electrode and a control gate electrode are formed between its source and drain regions. In other words, each of the aforementioned MOS memory cells is a nonvolatile memory cell of the floating gate type.

Between the cells, moreover, there are arranged a number of word lines $W_1$, $W_2$, $W_3$ and so on, a number of bit lines $B_1$, $B_2$, $B_3$ and so on, and a number of selection lines $S_1$, $S_2$ and so on, which are wired, as shown. Also illustrated are a word selector 12, a bit selector and read-out circuit 14, and a cell selector 16, respectively. Incidentally, a write-in circuit is included in the bit selector and read-out circuit 14. The cell selector 16 is made operative to drive the selection lines $S_1$, $S_2$ and so on in a manner to permit reading out information from a preset memory cell, which is connected with a preset bit line, in the case where a certain word line is selected. As a result, when it is intended to read out the information through the bit line $B_2$, for example, selection signals are fed to the selection lines $S_1$ and $S_2$ at different timings.

The write-in and read-out operations of the memory cells are performed in a manner which will now be described in detail. Here, the memory cells are assumed to be FAMOS FETs of the N-channel type.

(1) Write-in of Memory Cell $Q_{12}$

The bit line $B_2$ and the word line $W_1$ are selected. Specifically, the bit line $B_2$ is fed with a voltage of about $+15$ V, and the word line $W_1$ is fed with a voltage of about $+25$ V. On the other hand, the selection line $S_1$ is fed with a selection signal at ground level. As a result, the voltage at the floating gate electrode of the memory cell $Q_{12}$ is set at about $+12$ V by the voltage of $+25$ V, which is fed to the word line $W_1$. By means of that voltage of $+12$ V, the hot electrons existing on the substrate surface are attracted to the floating gate electrode. The writing operation into the memory cell $Q_{12}$ is accomplished in the manner thus far described.

The threshold voltage $V_{th}$ written in the memory cell $Q_{12}$ becomes higher than the threshold voltage $V_{th}$ of the other memory cells, which are left unwritten, such as the memory cell $Q_{13}$. Here, the information of the memory cell for the lower threshold voltage $V_{thL}$ is at a logic level of "1," whereas the information of the memory cell of the higher threshold voltage $V_{thH}$ is at a logic level of "0." Therefore, the memory cell $Q_{12}$ stores a logical "0," whereas the memory cell $Q_{13}$ stores a logical "1."

(2) Read-out of Memory Cell $Q_{12}$

The bit line $B_2$ and the word line $W_1$ are selected. Specifically, the bit line $B_2$ and the word line $W_1$ are fed with voltages of $+2$ V, and $+5$ V respectively. At the same time the selection line $S_1$ is fed with a signal at ground level. The memory cell $Q_{12}$ is storing a logical "0," i.e., $V_{thH}$. Consequently, the memory cell $Q_{12}$, i.e., the MOS FET, is not turned on even in response to the voltage of $+5$ V, which is fed to the word line $W_1$, so that no current flow takes place between the source and the drain. Accordingly, no change is seen on the bit line $B_2$. This condition is read out by means of the readout circuit which responds to no change on line $B_2$ by assuming that a logical "0" is stored in memory cell $Q_{12}$.

Thus, the reading operation out of the memory cell $Q_{12}$ is accomplished.

Incidentally, if the information of the memory cell $Q_{12}$ is to be erased for changing the program, the hot electrons, which have been trapped in the floating gate electrode of the memory cell $Q_{12}$, are erased by the use of ultraviolet rays.

One embodiment, especially, of the EPROM comprising the cell array circuit 10 shown in the circuit diagram of FIG. 1 will be described in the following with reference to FIGS. 2 to 4. Portions similar to those in FIG. 1 are denoted with similar reference numerals.

Figure 2:
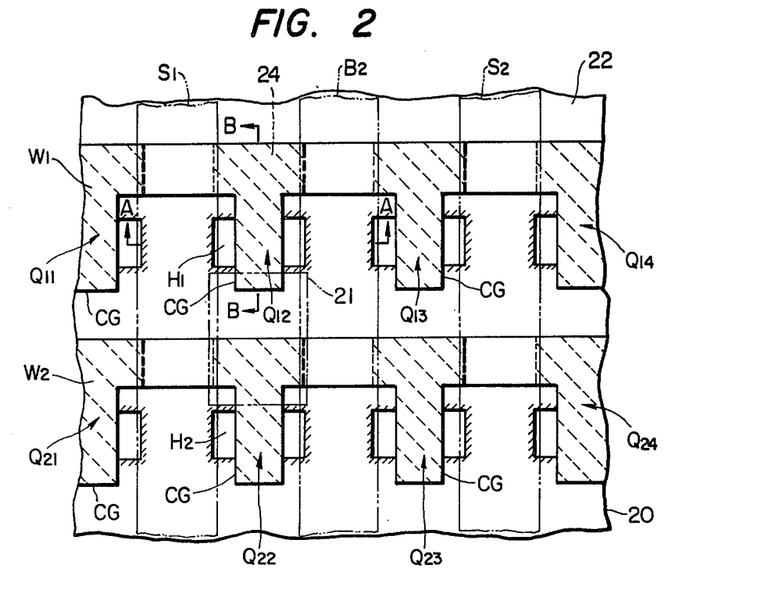
FIG. 2 is a surface view showing a semiconductor memory device according to one embodiment of the present invention, especially a memory array including a plurality of memory cells.

On a semiconductor substrate 20 made of P-type silicon, for example, there are alternately arranged in columns a number of selection lines and bit lines, as shown in FIG. 2.

In other words, the selection line $S_1$, the bit line $B_2$ and the selection line $S_2$ are formed in this order on the semiconductor substrate 20. Those selection lines $S_1$ and $S_2$ and the bit line $B_2$ are made of semiconductor regions of the opposite conduction type to that of the semiconductor substrate 20, i.e., of N+-type. These regions are positioned beneath a relatively thick insulating film which is selectively buried, as shown in FIG. 3, such as an isolating oxide film 22 which is formed by selectively oxidizing the surface of the semiconductor substrate (and which will be called a field oxide film hereinafter). The formations of those selection lines $S_1$ and $S_2$ and bit line $B_2$ are accomplished through the use of a mask for selectively forming the field oxide film, as will be described hereinafter.

The word lines $W_1$ and $W_2$ are arranged to extend on the semiconductor substrate 20 such that they intersect the selection lines $S_1$ and $S_2$ and the bit line $B_2$ at a right angle. Word lines $W_1$ and $W_2$ are formed so as to have portions which extend between the selection line $S_1$ and the bit line $B_2$. These portions, which contain the respective control gates CG, protrude into areas $H_1$ and $H_2$ where the thick field oxide film 22 is not formed, i.e., the holes in the field oxide film 22. In the hole $H_1$ in the aforementioned field oxide film, is formed a memory cell $Q_{12}$ which has the sectional construction shown in FIGS. 3 and 4. As shown in FIG. 3, more specifically, the memory cell $Q_{12}$ is constructed of: a floating gate layer 24 and a control gate layer 26, which are selectively formed on the semiconductor substrate 20 at the hole $H_1$; and an N++-type source region 27 and an N++-type drain region 28, which are selectively formed in the semiconductor substrate 20 in self-alignment with respect to those gate layers 24 and 26 and the field oxide film 22. The aforementioned source and drain regions 27 and 28 are positioned, so as to be in contact with the selection and bit lines $S_1$ and $S_2$, respectively, which are made of an N+-type semiconductor region.

Figure 4:
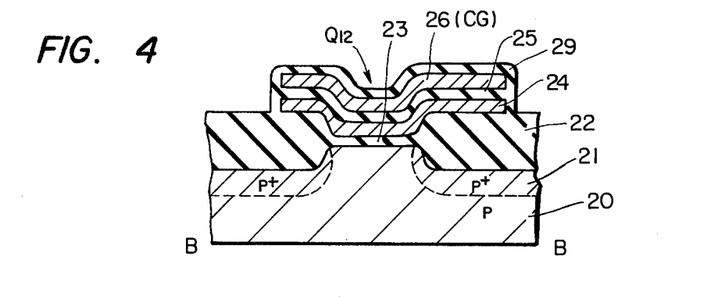
FIG. 4 is a cross-section showing the semiconductor memory device cut along line B—B of FIG. 2.

FIG. 4 is a sectional view of the memory cell $Q_{12}$ taken along line A—A of FIG. 2. The floating gate layer 24 and the control gate layer 26 terminate on the field oxide film 22. Reference numeral 21 indicates a P+-type channel stopper, which is formed between the memory cells in the line direction of the memory array to thereby prevent the memory cells in the line direction from being electrically connected by N-type parasitic channels as inverted from P-type to N-type on the surface of the semiconductor substrate beneath the field oxide film 22. The P+-type channel stopper 21, thus formed, is arranged as shown in FIG. 2, not only between the memory cells $Q_{12}$ and $Q_{22}$ but also between the memory cells $Q_{11}$ and $Q_{21}$, between the memory cells $Q_{13}$ and $Q_{23}$ and between the memory cells $Q_{14}$ and $Q_{24}$.

The method of fabricating the aforementioned EPROM will be described in the following with reference to FIGS. 5A to 5E, FIGS. 6A to 6E and FIGS. 7A and 7E.

Figure 6A:
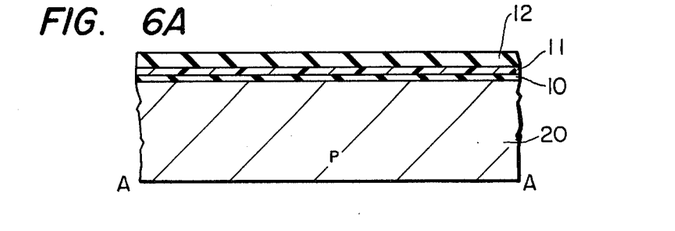
FIGS. 6A to 6E are cross-sections showing the steps of fabricating the semiconductor memory device shown in FIG. 3.
Figure 7A:
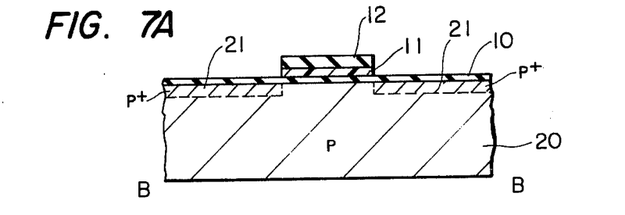
FIGS. 7A to 7E are cross-sections showing the steps of fabricating the semiconductor memory device shown in FIG. 4.

(a) Referring first to FIGS. 5A, 6A and 7A, the single-crystalline semiconductor substrate 20 (which will hereinafter be referred to as "the Si substrate") made of P-type silicon has its surface thermally oxidized to form an $SiO_2$, (silicon dioxide) film 10 having a thickness of 1000 Å. The surface of the $SiO_2$, film 10 thus formed is further formed with an $Si_3N_4$ (silicon nitride) film 11 having a thickness of 1500 A. The $Si_3N_4$ film 11 is so formed that it is used as a mask for selectively oxidizing the Si substrate 20 and is made of a film which is made so impermeable as to prevent oxygen from moving into the Si substrate.

Incidentally, the $SiO_2$ film 10, which is formed prior to the $Si_3N_4$ film, is not absolutely indispensable but is formed for the following reason.

Specifically, in a case where an $Si_3N_4$ film 11 is directly formed on the surface of the Si substrate 20, a heat distortion is established on the surface of the Si substrate 20 due to the difference in the thermal expansion coefficient between the Si substrate 20 and the $Si_3N_4$ film 11. A crystal defect will then result in the surface of the Si substrate 20. In order to prevent that defect, the $SiO_2$ film 10 is formed on the surface of the Si substrate 20 prior to the deposition of the $Si_3N_4$ film 11.

Figure 5A:
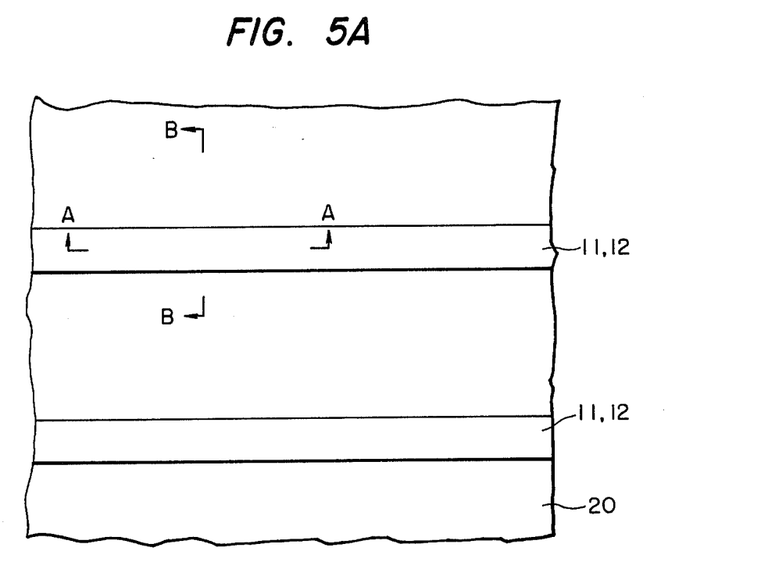
FIGS. 5A to 5E are surface views showing the steps of fabricating the semiconductor memory device shown in FIG. 2.

Next, the $Si_3N_4$ film 11 is selectively etched, as shown in FIG. 5A, by using a photo-resist film 12 as a mask. In order to form the P+-type channel stopper 21 shown in FIGS. 2 and 4, moreover, a P-type impurity such as boron as implanted, with the configuration in which the photo-resist film 12 is left, into the Si substrate 20 through the $SiO_2$ film 10 exposed to the outside. The P+-type semiconductor region 21 shown in broken lines in FIG. 7A is the P+-type channel stopper which is selectively formed by the aforementioned method.

Figure 5B:
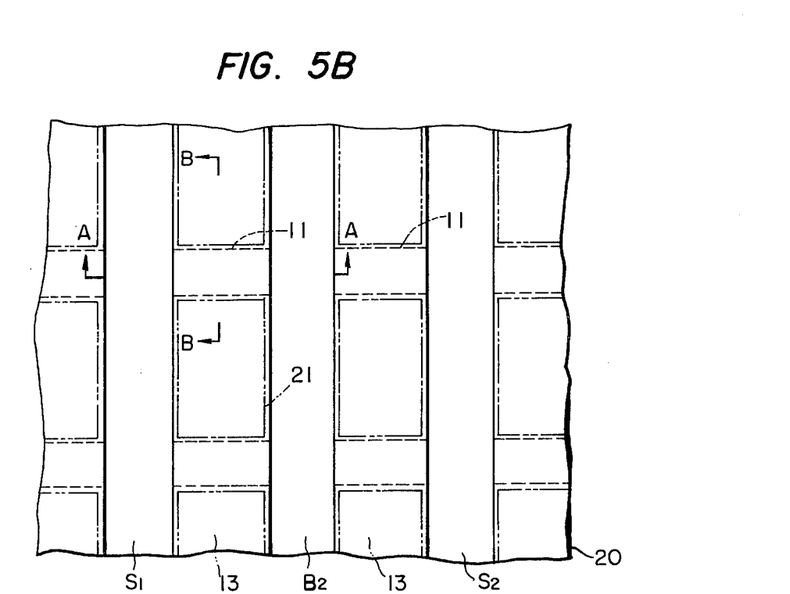
Figure 6B:
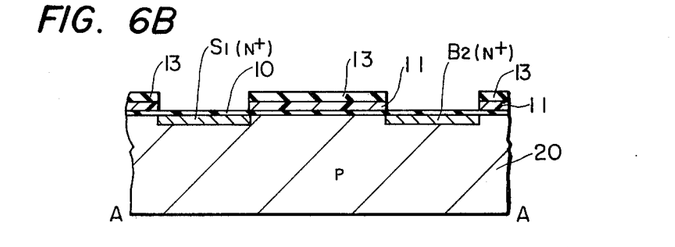
Figure 7B:
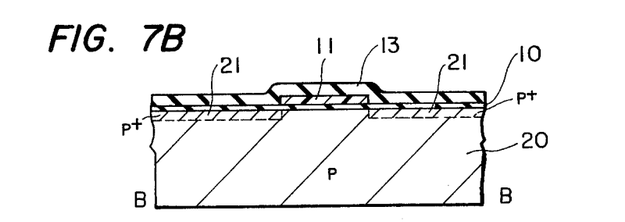

(b) Referring to FIGS. 5B, 6B and 7B, after the photoresist film 12 has been removed, the illustrated photo-resist film 13 is selectively formed and is used as a mask thereby to selectively etch the exposed $Si_3N_4$ film 11. With the configuration in which the photo-resist film 13 is left, an N-type impurity such as arsenic is implanted into the Si substrate 20 through the exposed $SiO_2$ film 10 by the ion implantation method, for example, thereby to form the selection lines $S_1$ and $S_2$ and the bit line $B_2$. As is apparent from FIGS. 5A and 5B, incidentally, the aforementioned arsenic impurity is introduced, too, into the portion which has been doped with the boron impurity for forming the channel stopper. Here, the quantity of the arsenic impurity to be introduced is sufficiently higher than that of the boron impurity to be introduced. As a result, the portion doped with the boron and arsenic impurities becomes an $N^+$-type semiconductor region completely so that the band-shaped selection lines $S_1$ and $S_2$ and bit line $B_2$, as shown in FIG. 5B, are formed in the Si substrate 20.

On the other hand, the channel stopper 21 is so defined as is shown in double-dotted lines by forming the aforementioned selection lines $S_1$ and $S_2$ and bit line $B_2$.

Figure 5C:
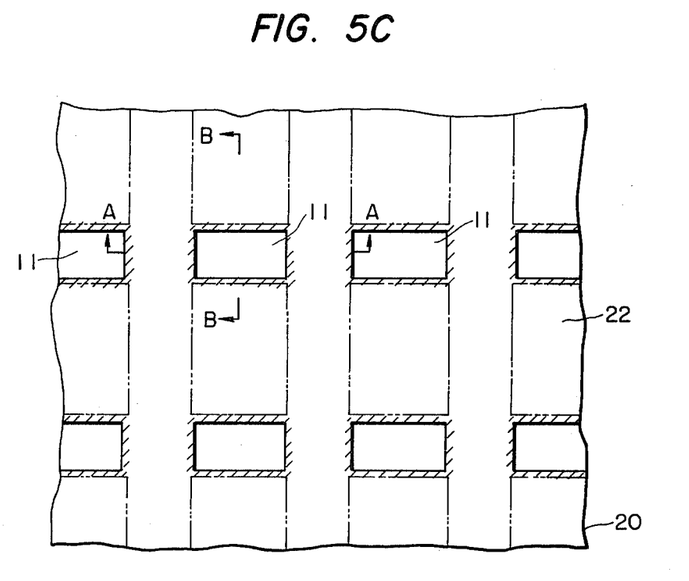
Figure 6C:
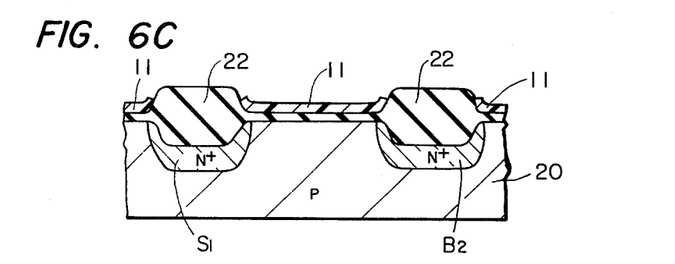
Figure 7C:
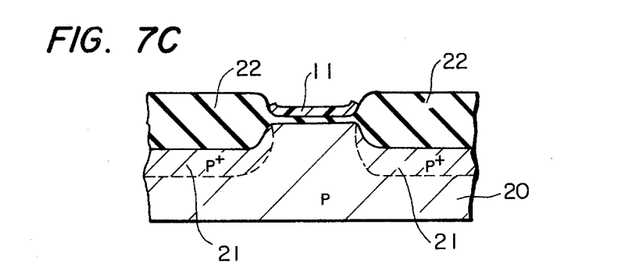

(c) Referring to FIGS. 5C, 6C and 7C, after the photo-resist film 13 has been removed, the residual $Si_3N_4$ film 11 is used as a mask to selectively form the field oxide film 22. More specifically, the Si substrate 20 is heated in an oxidizing atmosphere. As a result, the surface of the substrate 20, which does not have the $Si_3N_4$ film 11 formed thereon, is oxidized to form the field oxide film 22 having a thickness of about 12,000 Å.

As a result of the heating treatment at this time, the impurity in the $N^+$-type semiconductor regions $S_1$, $S_2$ and $B_2$ constructing the selection and bit lines is activated and redistributed so that the surface impurity concentration in those regions reaches a value of about $10^{21}$ atom/$cm^3$. On the other hand, the impurity in the channel stopper 21 is also extended and diffused so that the surface impurity concentration of that channel stopper reaches a value of about $10^{17}$ atoms/$cm^3$.

Figure 5D:
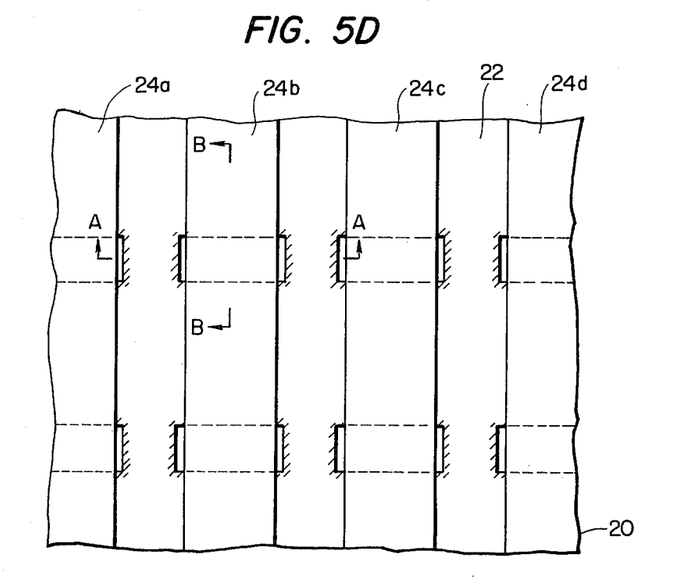
Figure 6D:
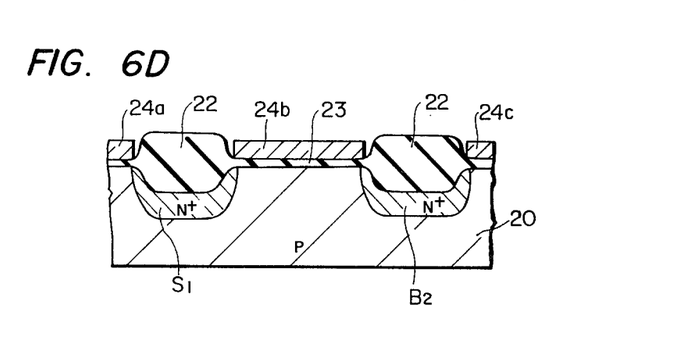
Figure 7D:
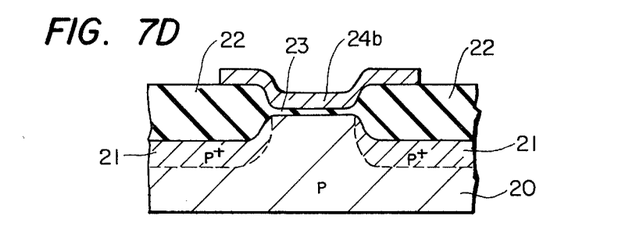

(d) Referring to FIGS. 5D, 6D and 7D, the $Si_3N_4$ film 11 and the underlying $SiO_2$ film 10 are etched and completely removed to expose the surface of the Si substrate 20 to the outside. After that, the surface of the exposed Si substrate 20 is thermally oxidized to form a gate oxide (i.e., gate $SiO_2$) film 23 having a thickness of about 500 Å.

In order to form the floating gate layer of the memory cell, moreover, a semiconductor layer, e.g., a polycrystalline silicon layer having a thickness of 3500 Å is formed on the $SiO_2$ films 23 and 24 by the CVD (Chemical Vapor Deposition) method. As shown in FIG. 5D, moreover, the resultant polycrystalline silicon is selectively etched to form band-shaped polycrystalline silicon layers 24a, 24b, 24c and 24d which intersect with the holes of the field oxide film.

Although not shown in the drawings, the gate electrode of a transistor, which constructs the word selector 14 shown in FIG. 2, for example, or a so-called "peripheral transistor," which is positioned at the periphery of the memory array, is formed by patterning the aforementioned polycrystalline silicon layers.

Figure 5E:
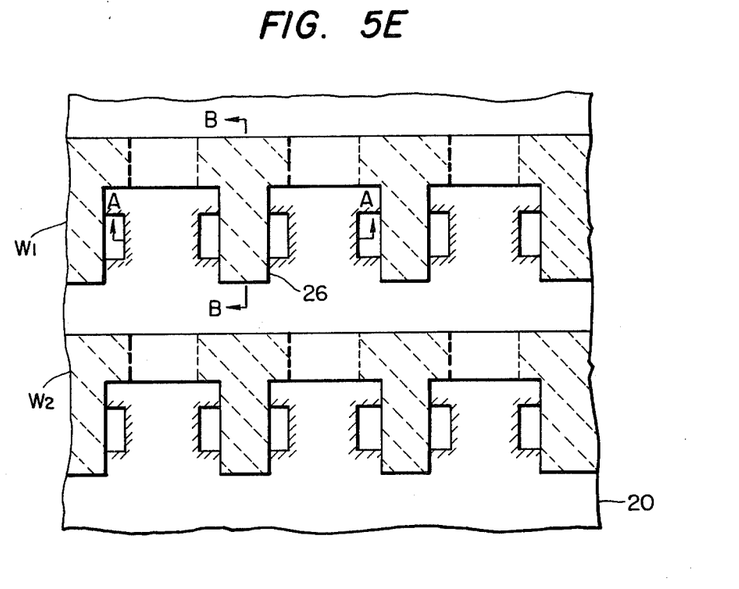
Figure 6E:
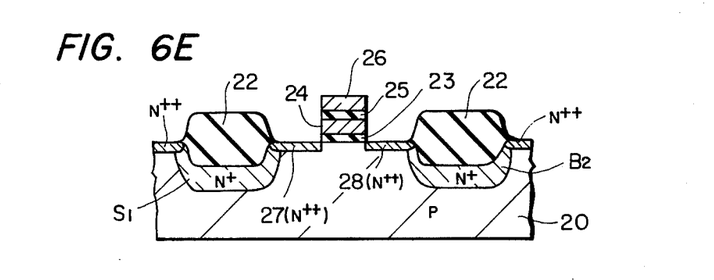
Figure 7E:
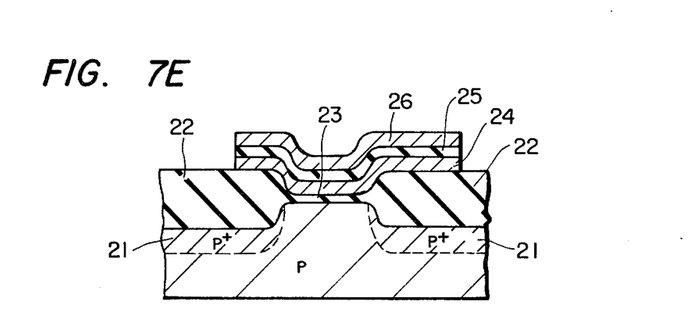

(e) Referring to FIGS. 5E, 6E and 7E, the surfaces of the aforementioned polycrystalline silicon layers 24a, 24b, 24c and 24d are oxidized to form a $SiO_2$ film 25 acting as an inter-layer insulating film. After that, in order to form the word lines including the control gate layers, a conductive layer, which can endure a high temperature treatment, such as a polycrystalline silicon layer is formed on that $SiO_2$ film 25 by the CVD method. This polycrystalline silicon layer should have a thickness of about 350 Å. After that, in order to reduce the specific resistance of the polycrystalline silicon layer, a phosphor impurity is doped into that polycrystalline silicon layer. In place of the polycrystalline silicon layer, moreover, a metallic material having a high melting point, such as molybdenum, tungsten or titanium, or their silicide such as molybdenum silicide may be used for forming the word lines. Preferably, since those metallic materials have remarkably smaller specific resistances than that of the polycrystalline silicon, an EPROM made of such materials will have a faster operating speed. Next, the resultant polycrystalline silicon layer is patterned into a preset shape thereby to form the word lines $W_1$ and $W_2$ and the control gate layer 26.

In a manner to correspond to the patterns of the aforementioned word lines and control gate layer, both the oxide film 25 beneath the word lines $W_1$ and $W_2$ and the control gate layer 26 and the residual first polycrystalline silicon layer are patterned to form the floating gate layer 24. The floating gate layer 24 thus formed corresponds to the portion which is indicated by hatched lines in FIG. 5E. Then, an ion implantation of phosphor, for example, is performed by using the accumulated gate layers 24 and 26 and the field oxide film 22 as masks thereby to form the $N^{++}$-type source region 27 and the $N^{++}$-type drain region 28 in self-alignment. In the meanwhile, phosphor is also introduced into the gate layer 26 and the word lines $W_1$ and $W_2$ thereby to further reduce their resistances. The source region 27 and the drain region 28 are formed in self-alignemnt in the selection line $S_1$ and the bit line $B_2$, respectively, because they are regulated by the field oxide film 22.

Figure 3:
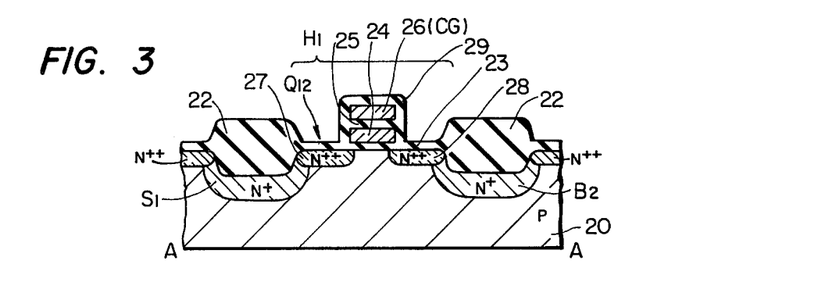
FIG. 3 is a cross-section showing the semiconductor memory device cut along line A—A of FIG. 2.

After that, as shown in FIGS. 3 and 4, the respective exposed portions of the word lines $W_1$ and $W_2$ and gate layers 23 and 25 are thermally oxidized to form an oxide film 29. If necessary, moreover, the substrate may be covered with a passivation film made of PSG (Phospho-Silicate Glass), for example.

The semiconductor memory devices according to the present invention thus far described have excellent operating effects, as follows.

(1) With the semiconductor memory device of the present invention, as shown in FIGS. 1 and 2, the selection lines $S_1$ and $S_2$ to be fed with the selecting signals for selecting the memory cells are interposed between the bit lines $B_1$, $B_2$, $B_3$ and so on of each two adjacent columns, and the plural memory cells $Q_{11}$ and $Q_{21}$; $Q_{12}$ and $Q_{22}$; $Q_{13}$ and $Q_{23}$; and $Q_{14}$ and $Q_{24}$ are interposed between those selection lines and bit lines. As a result, the bit lines $B_2$, $B_3$ and so on, other than the bit line $B_1$ at the end portion of the memory array, and the selection lines $S_1$ and $S_2$ can be used in common as the bit lines and the selection lines for the plural adjacent memory cells.

The selection line $S_1$, for example, is used in common both for the memory array of the first column, which is composed of the memory cells $Q_{11}$ and $Q_{21}$, and for the memory array of the second column, which is composed of the memory cells $Q_{12}$ and $Q_{22}$, as shown in FIGS. 1 and 2. On the other hand, the bit line $B_2$ is used in common both for the memory array of the second column and the memory array of the third column, which is composed of the memory cells $Q_{13}$ and $Q_{23}$. As a result, the total number of bit lines and selection lines is the number of the columns of the memory arrays plus one thereby making it possible to fabricate a semiconductor memory device having a higher density than that of the semiconductor memory device which is constructed of one bit line for the memory array of each column.

(2) Since a selection line never fails to exist between the bit lines of each two adjacent columns, there is no special necessity for providing a mutual interference preventing region, by means of which the adjacent bit lines are spaced sufficiently as to prevent mutual interference, while forming the channel stopped, in contrast to the semiconductor memory device in which one bit line is constructed for the memory array of each column. As a result, a semiconductor memory device having higher density and reliability than those of the aforementioned semiconductor memory device according to the prior art can be fabricated.

(3) In the usual semiconductor device, the substrate surface beneath the field oxide film is formed with only the channel stopper. On the contrary, according to the semiconductor memory device of the present invention, since the bit lines and the selection lines are arranged beneath the field oxide film, it is unnecessary to partially expose the drain to the outside and to form an ohmic contact at the exposed part, so that the size of the cell can be accordingly reduced.

(4) Since the source and drain regions are self-aligned with respect to the bit and selection lines, respectively, and with respect to the gate electrode, it is unnecessary to provide a mask aligning space, so that the wiring space and the cell size can be accordingly reduced.

As has been apparent from the foregoing description, with the semiconductor memory device of the present invention, the operational efficiency and the cell integration density of the semiconductor substrate can be remarkably improved.

Another embodiment of the EPROM comprising the cell array circuit 10 shown in FIG. 10 will be described in the following with reference to FIGS. 8 to 12. Incidentally, similar parts to those in FIG. 1 are indicated with similar reference numerals.

Figure 8:
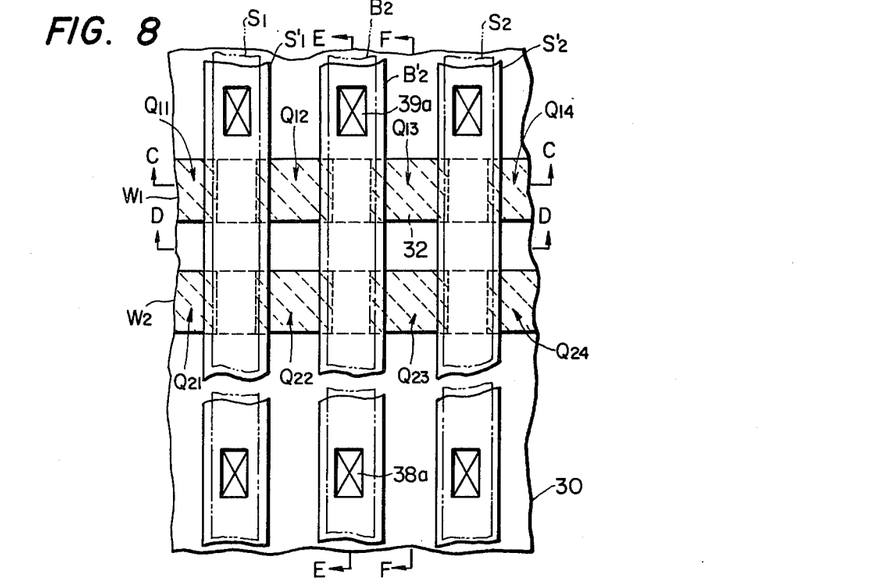
FIG. 8 is a surface view showing a semiconductor memory device according to another embodiment of the present invention, especially a memory array including a plurality of memory cells.

In this second embodiment, the arrangements of the bit lines, the selection lines and the memory cells are basically the same as in the aforementioned embodiment. The items, which, in the second embodiment, differ from the aforementioned embodiment, are, as follows.

(1) As shown in FIG. 8, the word lines $W_1$ and $W_2$, which intersect with the selection lines $S_1$ and $S_2$ and the bit line $B_2$ at a right angle, have no protruding control gate, thereby differing from the aforementioned embodiment. Specifically, the memory cells $Q_{11}$ to $Q_{14}$ and $Q_{21}$ to $Q_{24}$ are arranged just beneath the band-shaped word lines $W_1$ and $W_2$.

Figure 11:
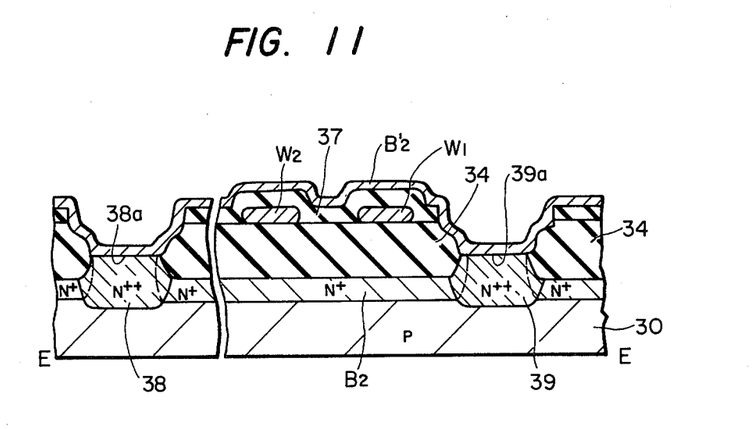
FIG. 11 is a cross-section showing the semiconductor memory device cut along line E—E of FIG. 8.

(2) As shown in FIGS. 8 and 11, the selection lines $S_1$ and $S_2$ and the bit line $B_2$ are connected with metal layers $S'_1$, $S'_2$ and $B'_2$, which extend, on a semiconductor substrate 30, in the same direction as those lines, to thereby reduce the resistances of the selection lines $S_1$ and $S_2$ and the bit line $B_2$. The connections between those lines and metal layers are performed, as shown in detail in FIG. 11, by steps as follows: introducing an impurity of the same conduction type as that of the N+-type semiconductor region constructing the bit line $B_2$ into the surface of the semiconductor of the semiconductor substrate 30, which is not covered with a field oxide film 34, while using the field oxide film 34 as a mask, thereby to form N++-type contact regions 38 and 39 contacting with that bit line $B_2$; and forming the semiconductor substrate 30 with the metal layer $B'_2$ contacting the contact regions 38 and 39.

Thus, the connections between the selection lines and the metal layers and between the bit line and the metal layer are accomplished.

Figure 9:
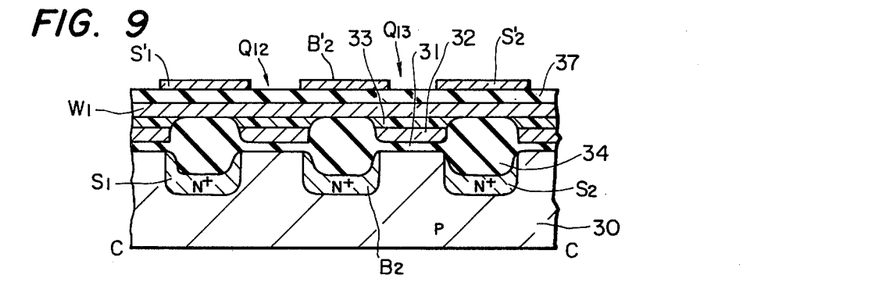
FIG. 9 is a cross section showing the semiconductor memory device cut along line C—C of FIG. 8.

(3) As shown in FIG. 9, the field oxide film 34 is self-aligned with respect to a floating gate layer 32. As a result, the floating gate layer 32 does not extend substantially above the field oxide film 34.

(4) The word lines $W_1$ and $W_2$ extend over the generally flat semiconductor substrate because of the feature noted in the aforementioned item (3).

(5) As shown in FIG. 9, the selection lines $S_1$ and $S_2$ and the bit line $B_2$ are self-aligned with respect to the floating gate layer 32.

Figure 10:
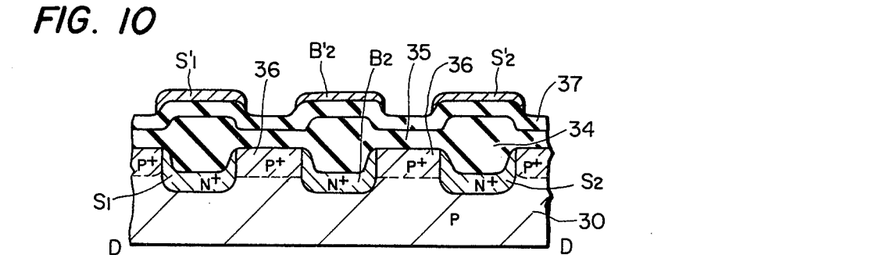
FIG. 10 is a cross-section showing the semiconductor memory device cut along line D—D of FIG. 8.
Figure 12:
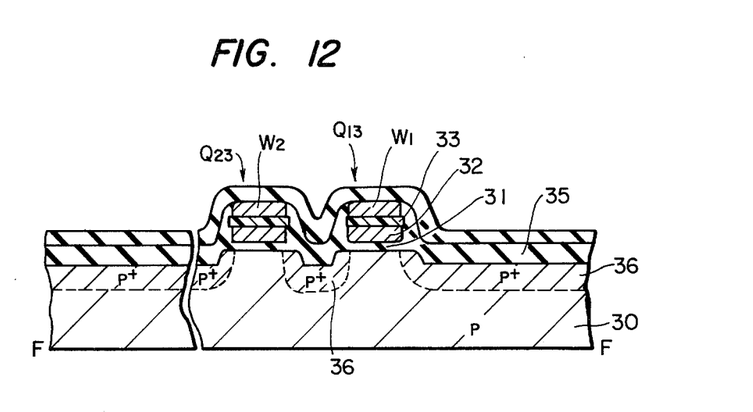
FIG. 12 is a cross-section showing the semiconductor memory device cut along F—F of FIG. 8.

(6) As shown in FIGS. 8, 10, and 12, a channel stopper 36 is self-aligned with respect to the word lines $W_1$ and $W_2$ and the field oxide film 34.

The method of fabricating the aforementioned EPROM will be described in the following with reference to FIGS. 13A and 13B, FIGS. 14A and 14B and FIG. 15.

(a) Referring to FIGS. 13A and 14A, for example, the surface of the single-crystalline semiconductor substrate 30 (hereinafter referred to as "the Si substrate 30") made of P-type silicon is thermally oxidized to form a gate oxide (gate $SiO_2$) film 31 having a thickness of 500 Å all over the substrate surface. A first polycrystalline silicon layer for forming the floating gate layer 32 is then deposited on the gate $SiO_2$ film 31 by the CVD method. The polycrystalline silicon layer thus formed has a thickness of about 3500 Å. This polycrystalline silicon layer is then doped with phosphor or the like to have its resistance reduced. This polycrystalline silicon layer having a reduced resistance is then thermally oxidized, if necessary, to form a thin oxide film (not shown). After that, a $Si_3N_4$ film 33' to be used as a mask for selectively forming the field oxide film is deposited upon the polycrystalline silicon layer. Those $Si_3N_4$ film and polycrystalline silicon layers thus prepared are selectively etched by using a photoresist film as a mask. Incidentally, the $Si_3N_4$ film 33 and an underlying polycrystalline silicon layer 32a are left on the portions to be formed with contact portions 38a and 39a, as shown in FIGS. 8 and 11.

In order to form the selection lines $S_1$ and $S_2$ and the bit line $B_2$, a phosphor or arsenic impurity is introduced into the Si substrate 30 through the exposed gate $SiO_2$ film 31 under the conditions in which the aforementioned photo-resist film is left, by the ion implantation method. The resulting N+ regions forming the selection lines $S_1$ and $S_2$ and the bit line $B_2$ are self-aligned with respect to the $Si_3N_4$ film 33 and the polycrystalline silicon layer 32a. After that, the aforementioned photo-resist film is removed, and the remaining $Si_3N_4$ film 33 and polycrystalline silicon layer 32a are used as masks to oxidize the portions of the surface of the Si substrate 30, which are not covered with those films 33 and 32a, by the heat treatment in an oxidizing atmosphere thereby to form a field oxide film 34 having a thickness of 12,000 Å. By the heat treatment at this time, the impurity in the N+-type semiconductor regions $S_1$, $S_2$ and $B_2$ forming the selection lines and the bit line is activated and redistributed so that the surface impurity concentration of those regions takes a value of about $10^{21}$ atoms/cm$^3$. The aforementioned $Si_3N_4$ is used as an inter-layer insulating film as it is. According to another method, after the remaining $Si_3N_4$ has been removed, the surface of the first polycrystalline silicon layer which is left is oxidized to form a silicon oxide, which can also be used as the inter-layer insulating film.

Figure 14A:
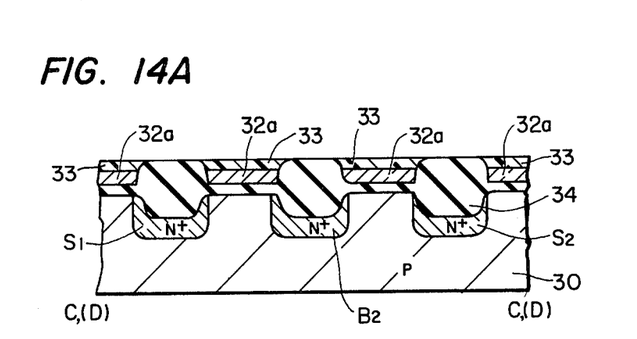
FIGS. 14A and 14B are cross-sections showing the steps of fabricating the semiconductor memory device shown in FIG. 9.

As is apparent from FIG. 14A, the field oxide film 34 is self-aligned with respect to the polycrystalline silicon layer 32a. Moreover, that field oxide film 34 is so formed as to completely enclose the polycrystalline silicon layer 32a.

Figure 13A:
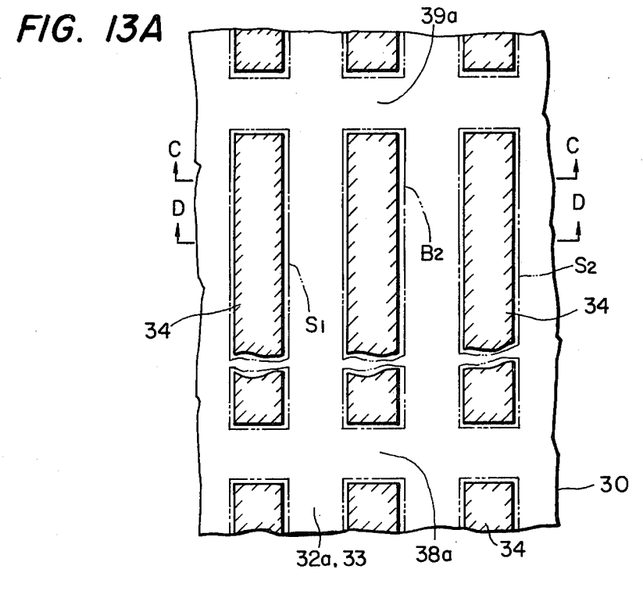
FIGS. 13A and 13B are surface views showing the steps of fabricating the semiconductor memory device shown in FIG. 8.

Incidentally, FIG. 14A is not only a sectional view cut along the line C—C of FIG. 13A but also a sectional view cut along the line D—D of FIG. 13A.

Figure 13B:
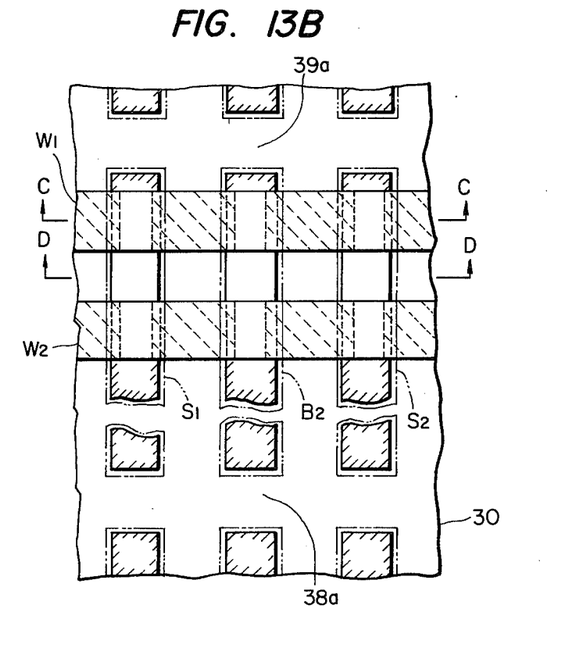
Figure 14B:
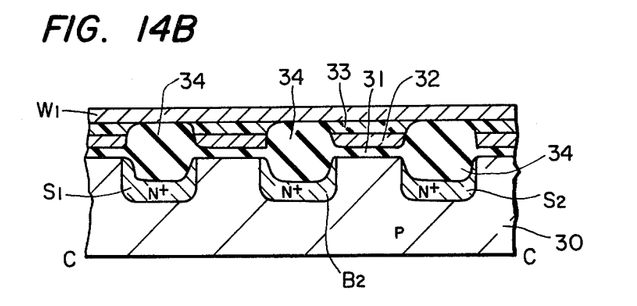
Figure 15:
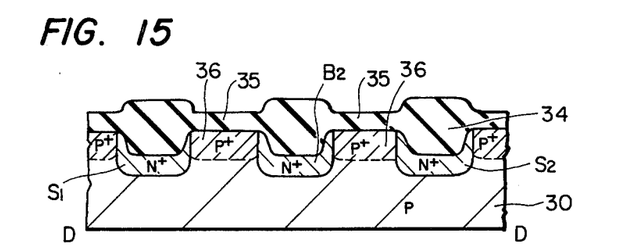
FIG. 15 is a cross-section showing the step of fabricating the semiconductor memory device shown in FIG. 10.

(b) Referring now to FIGS. 13B, 14B and 15, a second polycrystalline silicon layer for forming the word lines $W_1$ and $W_2$, also acting as the control gates, is deposited upon the upper surface of the Si substrate 30 and is doped with phosphor or the like thereby to have its resistance reduced. Then, the second polycrystalline silicon layer having reduced resistances, the $Si_3N_4$ film 34 and the first polycrystalline silicon layer 32a are etched to have preset patterns by using a photo-resist film as a mask. More specifically, the second polycrystalline silicon layer is formed into such a wiring layer as intersects with the selection lines $S_1$ and $S_2$ and the bit line $B_2$ at a right angle.

Thus, word lines $W_1$ and $W_2$, acting also as the control gates, are formed.

In the meanwhile, the $Si_3N_4$ film 33 and the first polycrystalline silicon layer 32a, which are arranged at the portion to be formed with the contacts 38a and 39a, are removed. On the other hand, the floating gate layer 32 formed corresponds to the rectangular portion which is hatched in broken lines in FIG. 13B. The rectangular portions of the word lines $W_1$ and $W_2$ overlying the respective floating gate layers 32 through the $Si_3N_4$ film 33 correspond to the control gates.

By the steps thus far described, the selection lines $S_1$ and $S_2$ and the bit line $B_2$ are formed in shapes such as to be self-aligned with respect to the floating gate layer 32, and those portions of the selection lines $S_1$ and $S_2$ and the bit line $B_2$, which overlie on the floating gate layer 32, act as the source and the drain, respectively.

Then, after the word lines $W_1$ and $W_2$ have their surfaces oxidized and covered with oxide films (not shown), a boron impurity is selectively introduced into the Si substrate 30 by the ion implantation method while using as masks the word lines $W_1$ and $W_2$ covered with those oxide films and the field oxide film 34. After that, a relatively thin field oxide film 35 is formed by a thermally oxidizing treatment, and the boron, which has been previously implanted into the substrate, is activated and redistributed by the heat treatment at that time thereby to form a P+-type channel stopper 36 beneath the field oxide film 35. As has been described in the above, this P+-type channel stopper 36 is formed in such a shape as to be self-aligned with respect to the word lines $W_1$ and $W_2$ and the field oxide film 34.

(c) As shown in FIG. 11, the field oxide film at the contacts 38a and 39a is etched by a selectively etching treatment using a photo-resist film as a mask, thus forming contact holes which expose the surface portion of the Si substrate to the outside. The field oxide film removed in this step corresponds to the relatively thin field oxide film 35. As a result, the contact holes can be formed more easily than the contact holes to be formed in the relatively thick field oxide film 34. As is apparent in view of FIGS. 13A and 14A, moreover, since the thick field oxide film 34 is formed in the wiring direction of the selection lines $S_1$ and $S_2$ and the bit line $B_2$, it is unnecessary to accurately align the mask.

(d) As shown in FIGS. 9 to 12, a passivation film 37 made of PSG is then formed on the upper surface of the Si substrate such that it covers the word lines $W_1$ and $W_2$, and the exposed portions of the field oxide films 34 and 35, respectively. Moreover, PSG film 37 is subjected to a suitable heat treatment thereby to minimize the step thereof, and the Si substrate 30 is doped at the contacts 38a and 39a, with the phosphor coming from the N++-type contact regions 38 and 39 leading to the bit line $B_2$.

After the passivation film 37 has been formed with the contact holes for exposing the contact regions 38 and 39 to the outside, the whole surface of the substrate is covered with a metal such as aluminum, and said metal is suitably patterned to form such metal layers $S'_1$, $S'_2$ and $B'_2$ which correspond to the selection lines $S_1$ and $S_2$ and the bit line $B_2$, respectively, and extend thereover in similar manner to those, respectively. These metal layers are provided for reducing the resistances of the corresponding selection or bit lines. For, taking the metal layer $B'_2$, as a representative, this layer $B'_2$ is electrically short-circuited with the bit line $B_2$ through the N++-type contact regions 38 and 39, respectively. This similarly applies to the other metal layers $S'_1$, $S'_2$ and so on. In this instance, the interval at which the bit line $B_2$ and the metal layer $B'_2$ are connected can be determined such as to correspond to the distance of 16 or 32 bits, for example, of the memory cell array.

In such a manner, the semiconductor memory device according to the second embodiment of the present invention can be fabricated.

With the semiconductor memory device having the construction thus far described, the following excellent operating effects can be attained in addition to those of the items (1) to (3) which have been previously described for the foregoing first embodiment.

(1) The bit and selection lines are in self-alignment relationship with the gate layer of each memory cell, and the source and drain of each memory cell are constructed of the portions of the selection and bit lines, respectively. As a result, the integration density can be more improved over that of the semiconductor memory device according to the foregoing first embodiment.

The gap between the word lines can be minimized, as shown in FIG. 8.

Since the field oxide film is formed by using the floating gate and the $Si_3N_4$ film formed thereon as masks, there is only a small step between the $Si_3N_4$ and the field oxide film. Therefore, the word lines $W_1$ and $W_2$ are not broken.

As is apparent from FIGS. 8 and 10, the P+-type channel stopper 36 is formed in self alignment between the memory cells in the column direction, e.g., between the memory cell $Q_{12}$ and the memory cell $Q_{22}$ while using the word lines $W_1$ and $W_2$ and the field oxide film 34 as the masks. As a result, no current flow takes place between the memory cells so that a highly reliable semiconductor memory device can be fabricated.

Since the plural portions of the semiconductor regions acting as the selection or bit lines are short-circuited through the metal layers, the resistances of the selection or bit lines can be remarkably reduced to provide an advantage when aiming at high speed.

Incidentally, the same method of reducing the resistances of the selection or bit lines can naturally be applied even to the semiconductor memory device according to the foregoing embodiments.

The memory cells according to the present invention, are not limited to the aforementioned embodiments. MOS FETs of either MNOS (i.e., Metal-Nitride-Oxide- Semiconductor) or MAOS (i.e., Metal-Alumina-Oxide-Semiconductor) type may be likewise used.

Moreover, the present invention is not limited to EPROMS but can be applied to dynamic RAMS. The memory cell to be used in the dynamic RAM is constructed of one memory capacitor and one MOS FET.

What is claimed is:

1. In a semiconductor memory formed on a semiconductor substrate with a major planar surface comprising a plurality of MOS type memory cells each having a source, control gate and drain arranged in an array of rows and columns; a plurality of row conductive layers each of which is electrically connected to the control gates of said MOS type memory cells located along a corresponding row; and a plurality of column conductive layers, adjacent column conductive layers being electrically connected to the source and drain respectively of each MOS type memory cell interposed therebetween, the improvement comprising: a thick insulating layer which is formed by selectively oxidizing said major planar surface of said semiconductor substrate so as to leave at least areas of said major surface which are arrayed along said rows, said thick insulating layer having portions which extend along said columns, said areas interposed between adjacent thick insulating layer portions; said plural MOS type memory cells being formed at said areas; said plurality of column conductive layers being respectively constructed of semiconductor layers which are formed in said semiconductor substrate beneath and along said thick insulating layer portions and which are self-aligned with said thick insulating layer portions; and said plural row conductive layers extending respectively across and above said thick insulating layer portions.

2. The semiconductor memory of claim 1 wherein the source and drain of each MOS type memory cell respectively comprise semiconductor regions formed in the corresponding area and continuous with the portions of the adjacent column semiconductor layers, extending to the corresponding area.

3. The semiconductor memory of claim 2, wherein each MOS type memory cell comprises a thin insulating layer on said area, a floating gate layer formed over said thin insulating layer, a further insulating layer on said floating gate layer and a control gate layer formed over said further insulating layer integrally with a row conductive layer.

4. The semiconductor memory of claim 1, wherein the sources and drains of each MOS type memory cell are respectively constructed of portions of the adjacent semiconductor layers extending to the corresponding area.

5. The semiconductor memory of claim 4, wherein each MOS type memory cell comprises a thin insulating layer on said area floating gate layer formed over said thin insulating layer, a further insulating layer on said floating gate layer and a control gate layer formed over said further insulating layer integrally with a row conductive layer.

6. The semiconductor memory of claim 1, wherein each MOS type memory cell comprises a thin insulating layer on said area, a floating gate layer formed over said thin insulating layer, a further insulating layer on said floating gate layer and a control gate layer formed over said further insulating layer integrally with a row conductive layer.

* * * * *